(12) United States Patent
Futashima

(10) Patent No.: US 11,199,519 B2
(45) Date of Patent: Dec. 14, 2021

(54) METHOD FOR PRODUCING SILVER-SILVER CHLORIDE ELECTRODE

(71) Applicant: NOK CORPORATION, Tokyo (JP)

(72) Inventor: Ryo Futashima, Kanagawa (JP)

(73) Assignee: NOK CORPORATION, Tokyo (JP)

( * ) Notice: Subject to any disclaimer, the term of this patent is extended or adjusted under 35 U.S.C. 154(b) by 0 days.

(21) Appl. No.: 16/977,974

(22) PCT Filed: Jun. 7, 2019

(86) PCT No.: PCT/JP2019/022707
§ 371 (c)(1),
(2) Date: Sep. 3, 2020

(87) PCT Pub. No.: WO2019/240030
PCT Pub. Date: Dec. 19, 2019

(65) Prior Publication Data
US 2021/0041390 A1    Feb. 11, 2021

(30) Foreign Application Priority Data

Jun. 14, 2018 (JP) .............................. JP2018-113792

(51) Int. Cl.
*H01M 4/54* (2006.01)
*G01N 27/30* (2006.01)
*G01R 31/16* (2006.01)
*H01M 4/58* (2010.01)

(52) U.S. Cl.
CPC ........... *G01N 27/301* (2013.01); *G01N 27/30* (2013.01); *G01R 31/16* (2013.01); *H01M 4/582* (2013.01)

(58) Field of Classification Search
CPC ...... G01N 27/30; G01N 27/301; C09D 11/52; A61B 5/25; A61B 5/265; H01M 4/54
See application file for complete search history.

(56) References Cited

U.S. PATENT DOCUMENTS

| | | | |
|---|---|---|---|
| 5,421,983 A * | 6/1995 | Slack | G01N 27/3335 204/403.06 |
| 6,134,461 A | 10/2000 | Say et al. | |
| 6,309,563 B1 | 10/2001 | Iino et al. | |
| 6,484,046 B1 | 11/2002 | Say et al. | |
| 7,384,523 B2 * | 6/2008 | Samproni | G01N 27/3335 204/418 |
| 2003/0088166 A1 | 5/2003 | Say et al. | |
| 2005/0008860 A1 | 1/2005 | Garnier | |
| 2006/0118415 A1 | 6/2006 | Say et al. | |
| 2010/0204554 A1 | 8/2010 | Say et al. | |
| 2010/0305422 A1 | 12/2010 | Say et al. | |
| 2013/0274574 A1 | 10/2013 | Say et al. | |
| 2014/0221801 A1 | 8/2014 | Say et al. | |
| 2018/0346757 A1 * | 12/2018 | Burrows | H01B 1/22 |
| 2019/0139670 A1 * | 5/2019 | Shinohara | H01B 1/22 |
| 2020/0305746 A1 * | 10/2020 | Futashima | A61B 5/25 |
| 2021/0172895 A1 * | 6/2021 | Offenbacher | G01N 27/301 |

FOREIGN PATENT DOCUMENTS

| | | | | |
|---|---|---|---|---|
| EP | 1 039 480 A1 | 9/2000 | | |
| JP | H5-142189 A | 6/1993 | | |
| JP | 2000-357547 A | 12/2000 | | |
| JP | 2005-513423 A | 5/2005 | | |
| JP | 2005-292022 A | 10/2005 | | |
| JP | 2012-11208 A | 1/2012 | | |
| JP | 2018-174125 A | 11/2018 | | |
| WO | 98/03431 | 1/1998 | | |
| WO | WO 98/03431 A1 | 1/1998 | | |
| WO | WO-0104614 A1 * | 1/2001 | ............ | C12Q 1/001 |
| WO | WO 03/046051 A1 | 6/2003 | | |
| WO | WO-2017031487 A1 * | 2/2017 | ............ | C09D 11/52 |
| WO | 2018/008688 | 1/2018 | | |

OTHER PUBLICATIONS

Fabrication of a microfluidic Ag/AgCl reference electrode and its application for portable and disposable electrochemical microchips, Zhou et al., Electrophoresis 2010, 31, 3083-3089.*
ISR for PCT/JP2019/022707, dated Sep. 3, 2019.
Extended European Search Report issued in Application No. 19820529. 6, dated Jun. 15, 2021.
Anonymous, "Creative Materials Introduces new electrically conductive medical silver/silver-chloride (Ag/AgCl) electrode ink", dated Feb. 1, 2016 (according to EESR), 1 page.
Creative Materials "126-49 Silicone Medical Electrode Ink", Creative Materials, Inc., dated Feb. 12, 2016 (according to EESR), 1 page.

* cited by examiner

*Primary Examiner* — Haidung D Nguyen
(74) *Attorney, Agent, or Firm* — Greenblum & Bernstein, P.L.C.

(57) ABSTRACT

A method for producing a silver-silver chloride electrode includes: producing a paste by mixing silver powder, silver chloride powder, a dispersant, and fumed silica powder with a liquid silicone rubber binder; coating the paste on a substrate made of silicone rubber; curing the paste on the substrate to form an electrode containing silver and silver chloride; and immersing the electrode in a sodium chloride aqueous solution.

8 Claims, 3 Drawing Sheets

Fig. 2

| MATERIALS | DETAILS OF MATERIALS | SAMPLE 1 | SAMPLE 2 | SAMPLE 3 | SAMPLE 4 | SAMPLE 5 |
|---|---|---|---|---|---|---|
| BINDER | "KE-106" (SHIN-ETSU CHEMICAL CO., LTD.) INCLUDING "CAT-RG"(SHIN-ETSU CHEMICAL CO., LTD.) | 100 | | | | |
| SILVER POWDER | "FA-2-3" (DOWA HITECH CO., LTD.) | 150 | | | | |
| | "G-35" (DOWA HITECH CO., LTD.) | 150 | | | | |
| SILVER CHLORIDE | PULVERIZED AgCl (INUISHO PRECIOUS METALS CO., LTD.) | 60 | 60 | 60 | 300 | 60 |
| DISPERSANT | "KF-6015" (SHIN-ETSU CHEMICAL CO., LTD.) | 10 | | | | |
| | "KF-6106" (SHIN-ETSU CHEMICAL CO., LTD.) | 10 | | | | |
| FUMED SILICA | "AEROSIL 200" (NIPPON AEROSIL CO., LTD.) [HYDROPHILIC] | 0.3 | 0.3 | | 1.5 | 0.3 |
| | "AEROSIL R972" (NIPPON AEROSIL CO., LTD.) [HYDROPHOBIC] | | | 0.3 | | |
| SALT WATER TREATMENT | | None | 1% | 1% | 10% | 10% |

| MATERIALS | DETAILS OF MATERIALS | SAMPLE 6 | SAMPLE 7 | SAMPLE 8 | SAMPLE 9 | SAMPLE 10 |
|---|---|---|---|---|---|---|
| BINDER | "KE-106" (SHIN-ETSU CHEMICAL CO., LTD.) INCLUDING "CAT-RG"(SHIN-ETSU CHEMICAL CO., LTD.) | 100 | | | | |
| SILVER POWDER | "FA-2-3" (DOWA HITECH CO., LTD.) | 150 | | | | |
| | "G-35" (DOWA HITECH CO., LTD.) | 150 | | | | |
| SILVER CHLORIDE | PULVERIZED AgCl (INUISHO PRECIOUS METALS CO., LTD.) | 300 | 60 | 300 | 0 | 0 |
| DISPERSANT | "KF-6015" (SHIN-ETSU CHEMICAL CO., LTD.) | 10 | | | | |
| | "KF-6106" (SHIN-ETSU CHEMICAL CO., LTD.) | 10 | | | | |
| FUMED SILICA | "AEROSIL 200" (NIPPON AEROSIL CO., LTD.) [HYDROPHILIC] | | | | | |
| | "AEROSIL R972" (NIPPON AEROSIL CO., LTD.) [HYDROPHOBIC] | 1.5 | | | | |
| SALT WATER TREATMENT | | None | - | - | 1% | 10% |

METHOD FOR PRODUCING SILVER-SILVER CHLORIDE ELECTRODE

TECHNICAL FIELD

The present invention relates to methods for producing silver-silver chloride electrodes.

BACKGROUND ART

Silver-silver chloride electrodes are widely used as measurement electrodes and reference electrodes for measuring minute currents in electrochemistry and electrophysiology because they are nonpolarizable, have a stable potential, and have a high charge transfer reaction rate.

As a method for producing a silver-silver chloride electrode, a method is known in which silver chloride is formed by electrolysis on a surface of a silver plate or silver wire immersed in a chloride solution. However, in this manufacturing method, it is difficult to reduce the size of the obtained electrode, and the shape of the electrode is also limited.

Furthermore, a method for producing a silver-silver chloride electrode composed of silver, silver chloride, and a heat-resistant resin formed on a substrate is known in which a conductive paste obtained by dispersing silver powder, silver chloride powder, and polyimide (binder) in an organic solvent is applied on the substrate and heated (Patent Document 1). Furthermore, Patent Document 2 discloses a method in which a paste in which silver particles are dispersed in a resin material is applied to a substrate to form an electrode, and then the electrode is treated with hypochlorous acid to make a surface of the electrode silver chloride.

BACKGROUND DOCUMENTS

Patent Document

Patent Document 1: JP-A-05-142189
Patent Document 2: JP-A-2005-292022

SUMMARY OF THE INVENTION

In recent years, studies using microfluidic devices has progressed in electrochemistry and electrophysiology. For example, it is conceivable to use silver-silver chloride electrodes to measure the microcurrent of fluid in a microfluidic device. In this case, a silver-silver chloride electrode is desired that has high adhesion to silicone rubber, which is a material for a plate used in a microfluidic device, and that can stably maintain high conductivity.

Accordingly, the present invention provides a method for producing a silver-silver chloride electrode having high adhesion to silicone rubber and being capable of stably maintaining high conductivity.

A method for producing a silver-silver chloride electrode according to an aspect of the present invention includes: producing a paste by mixing silver powder, silver chloride powder, a dispersant, and fumed silica powder with a liquid silicone rubber binder; coating the paste on a substrate made of silicone rubber; curing the paste on the substrate to form an electrode containing silver and silver chloride; and immersing the electrode in a sodium chloride aqueous solution.

In this aspect, it is possible to produce a silver-silver chloride electrode that has high adhesion to silicone rubber and can stably maintain high conductivity.

BRIEF DESCRIPTION OF THE DRAWINGS

FIG. 2 is a table showing materials of multiple samples of silver-silver chloride electrodes.

DESCRIPTION OF EMBODIMENT

Hereinafter, an embodiment according to the present invention will be described.

OUTLINE OF EMBODIMENT

A method for manufacturing a silver-silver chloride electrode according to the embodiment includes: a step of producing a paste by mixing silver powder, silver chloride powder, a dispersant, and fumed silica powder with a liquid silicone rubber binder; a step of coating the paste on a substrate made of silicone rubber; a step of curing the paste on the substrate to form an electrode containing silver and silver chloride; and a step of immersing the electrode in a sodium chloride aqueous solution.

The step of producing a paste includes a step of producing a mixture of fumed silica powder and silver chloride powder by, first, adding fumed silica to silver chloride, pulverizing and mixing the silver chloride and the fumed silica, and a step of adding the mixture, silver powder, and a dispersant to an RTV (Room Temperature Vulcanizing) silicone rubber.

Fumed silica powder functions as an aggregation inhibitor for silver chloride powder. When fumed silica is not used, silver chloride powder agglomerates. Preferably, the fumed silica powder is a hydrophilic fumed silica powder.

The dispersant disperses silver powder and silver chloride powder as uniformly as possible in a liquid silicone rubber binder. The dispersant is preferably a polyether-modified silicone surfactant having a polyether chain and a silicone chain, and/or a polyglycerin-modified silicone surfactant having a polyglycerin chain and a silicone chain.

Figure 1:
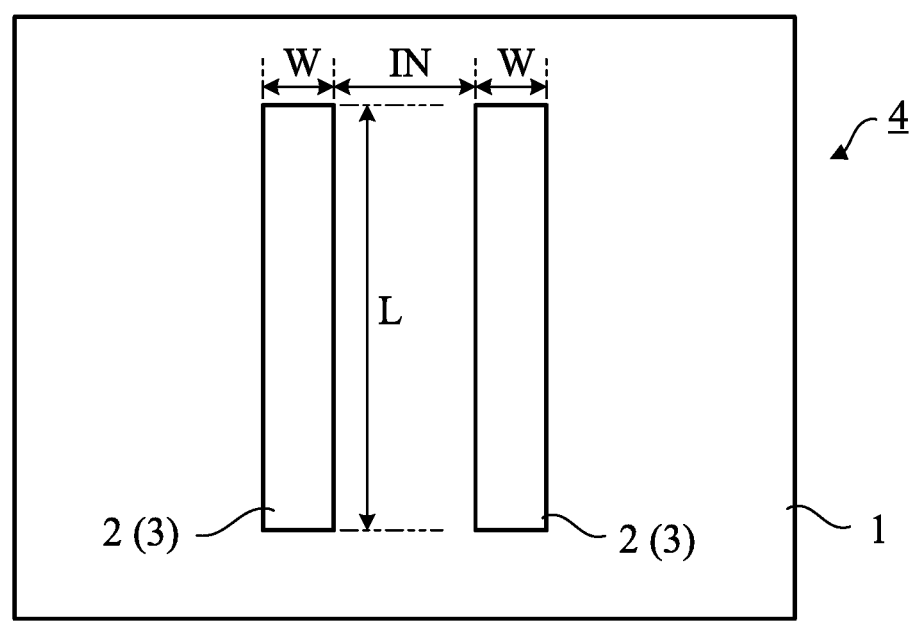
FIG. 1 is a plan view showing silver-silver chloride electrodes manufactured on a substrate.

In the step of coating the substrate with the paste, as shown in FIG. 1, a surface of the substrate 1 made of silicone rubber is coated with the paste 2 by a technique such as screen printing or ink jet printing. Curing of the paste 2 results in electrodes each containing silver, silver chloride, and silicone rubber. Furthermore, the silver-silver chloride electrodes 3 are manufactured by immersing the electrodes in a sodium chloride aqueous solution and drying them. In other words, a plate 4 having the silver-silver chloride electrodes 3 provided on a surface is manufactured.

In the illustrated embodiment, two silver-silver chloride electrodes 3 are formed on one surface of the substrate 1. However, one or three or more silver-silver chloride electrodes 3 may be formed on the substrate 1, or one or more silver-silver chloride electrodes 3 may be formed on both surfaces of the substrate 1.

In accordance with the silver-silver chloride electrode produced by this production method, in a case in which hydrophilic fumed silica powder is used, it is assumed that the affinity between the surfaces of silver chloride particles and electrolytes (for example, electrolytes in a solution to be measured) is improved since the surface of each silver chloride particle is coated with hydrophilic fumed silica. Although the conductivity of silver chloride itself is low, it is considered that the conductivity is improved by coating silver chloride particles with hydrophilic fumed silica. In addition, it is assumed that since the dispersant disperses silver powder and silver chloride powder, which are conductors, in silicone rubber, which is the binder, the conductor particles within the silver-silver chloride electrode are electrically connected to one other well, so that conductivity is also improved. Furthermore, the silicone rubber contained in the silver-silver chloride electrode contains chloride ions and sodium ions derived from sodium chloride by the step of immersing in a sodium chloride aqueous solution. Therefore, it is assumed that the conductivity is improved by ions in addition to the electrical connection of the conductor particles, so that a higher conductivity can be stably maintained.

In addition, by using silicone rubber as a binder, the produced silver-silver chloride electrode 3 has high adhesion to the silicone rubber and does not easily peel off or drop off from the substrate 1. Furthermore, since the silicone rubber contained in the silver-silver chloride electrode contains chloride ions and sodium ions derived from sodium chloride, it is expected to improve durability against external forces caused by, e.g., bending of the silver-silver chloride electrode.

PRODUCTION EXAMPLES

The inventor manufactured multiple samples each having silver-silver chloride electrodes by the manufacturing method according to the embodiment, and tested the conductivities of these samples. For comparison, multiple samples having silver electrodes were produced, and the conductivities of these samples was also tested.

FIG. 2 shows the materials of these samples and details of immersion in a sodium chloride aqueous solution (salt water treatment). In FIG. 2, the numerical values represent parts by weight. However, the "%" in the last line (salt water treatment) indicates the concentration of sodium chloride in the sodium chloride aqueous solution as a percentage, whereas "None" in the last line indicates that the electrodes were intentionally manufactured without performing the salt water treatment. The "-" in the last line indicates that the salt water treatment was abandoned, and that the conductivity test was not performed.

For Samples 1-6, in the step of producing a mixture of fumed silica powder and silver chloride powder, 0.5 parts by weight of fumed silica was added to 100 parts by weight of silver chloride, and then silver chloride and fumed silica were pulverized and mixed by means of a centrifugal mill. For Samples 1 to 6, the weight parts of silver chloride and fumed silica in the entire material are as shown in FIG. 2. The raw material silver chloride was produced by Inuisho Precious Metals Co., Ltd., Osaka, Japan. As the fumed silica, there were prepared "AEROSIL 200", which is a hydrophilic fumed silica manufactured by Nippon Aerosil Co., Ltd., Tokyo, Japan, and "AEROSIL R972" which is a hydrophobic fumed silica manufactured by the same company. "AEROSIL R972" was used for the manufacture of Samples 3 and 6, whereas "AEROSIL 200" was used for the manufacture of Samples 1, 2, 4, and 5. "AEROSIL" is a registered trademark. For pulverization and mixing, a centrifugal mill (trade name "ZM 200") manufactured by Retsch Co., Ltd. (currently Verder Scientific Co., Ltd.), Tokyo, Japan was used. Silver chloride and fumed silica were pulverized and mixed, so that the resulting particles passed through a 0.20 mm-mesh screen.

In samples 7 to 10, no fumed silica powder was used. The reason for not using fumed silica powder in Samples 7 and 8 was to confirm the effect of fumed silica powder as an aggregation inhibitor for silver chloride powder. The reason for not using fumed silica powder in Samples 9 and 10 was that no silver chloride powder was used, and therefore, fumed silica powder as an aggregation inhibitor was unnecessary.

For silicone rubber as the binder, a mixture of "KE-106", an RTV silicone rubber manufactured by Shin-Etsu Chemical Co., Ltd., Tokyo, Japan and "CAT-RG", a curing catalyst manufactured by the same company, was used.

As silver powder, there were prepared a flaky silver powder, "FA-2-3", manufactured by Dowa Hitech Co., Ltd., Saitama, Japan, and an irregular-shaped silver powder, "G-35" manufactured by the same company. Equal amounts of these were used in each of the samples.

As the dispersant, there were prepared polyether-modified silicone surfactant, "KF-6015" manufactured by Shin-Etsu Chemical Co., Ltd., and polyglycerin-modified silicone surfactant, "KF-6106", manufactured by the same company. Equal amounts of these were used in each of the samples.

For Samples 1 to 6, a paste was produced by adding silver powder, the dispersant, and the mixture of fumed silica powder and silver chloride powder to the binder and mixing them.

For Samples 7 and 8, silver powder, the dispersant, and silver chloride powder were added to the binder, and they were mixed, but since they did not contain fumed silica powder as an aggregation inhibitor for silver chloride powder, silver chloride powder agglomerated and a uniform paste could not be produced (thus, Samples 7 and 8 were not subjected to subsequent steps and to the test. In FIG. 2, the "-" in salt water treatment for Samples 7 and 8 means that neither the salt water treatment nor the conductivity test was conducted due to the paste being inferior). Samples 7 and 8 differed in the amount of silver chloride, but none of them could result in production of a uniform paste. Thus, the effect of fumed silica was confirmed.

For Samples 9 and 10, a paste was produced by adding silver powder and the dispersant to the binder and mixing them.

Then, for Samples 1 to 6, 9, and 10, as shown in FIG. 1, the paste 2 was coated by screen printing at two locations on a surface of a substrate 1 made of silicone rubber containing PDMS (polydimethylsiloxane). Furthermore, the paste 2 was cured by heating at 150 degrees Celsius for 30 minutes.

For Samples 2 to 5, 9, and 10, except for Samples 1 and 6, after curing the paste 2, the substrate 1 was immersed in a sodium chloride aqueous solution at room temperature for an hour together with the electrodes resulting from the paste 2, and they were then dried.

In each of produced Samples 1 to 6, the silver-silver chloride electrodes 3 had high adhesion to the silicone rubber and did not easily peel off or drop off from the substrate 1. Furthermore, in each of Samples 9 and 10 manufactured for comparison, the silver electrodes 3 had high adhesion to the silicone rubber and did not easily peel off or drop off from the substrate 1. In these samples, the length L of the electrodes 3 was 30 mm, the width W thereof was 5 mm, and the interval IN therebetween was 10 mm.

Figure 3:
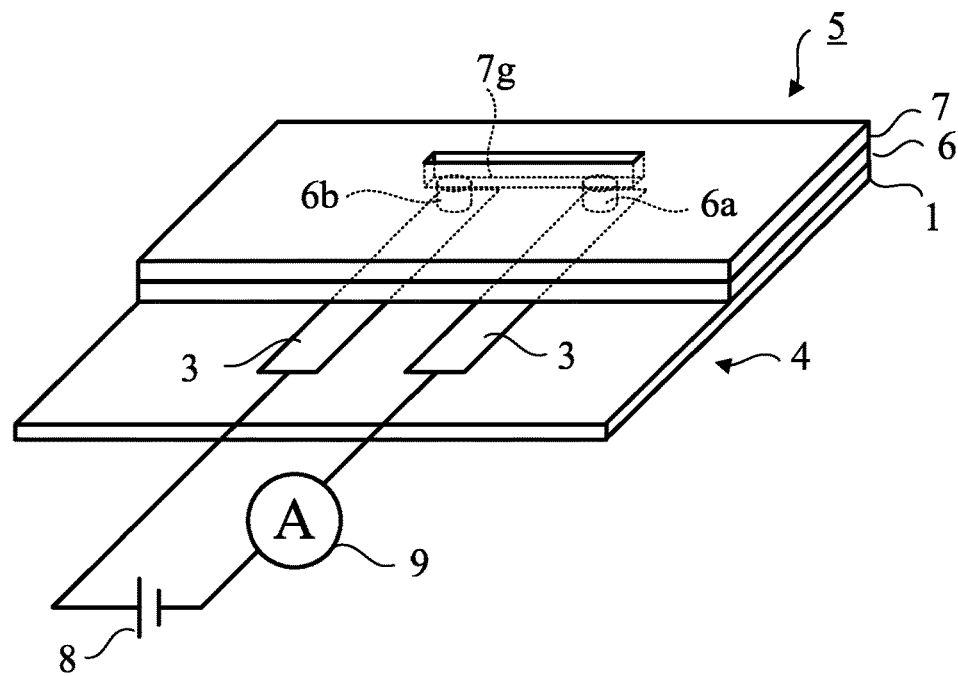
FIG. 3 is a schematic diagram showing an experimental apparatus for testing the conductivities of the samples.

Next, using each of produced Samples 1 to 6, 9, and 10, an experimental apparatus 5 shown in FIG. 3 was assembled. The experimental apparatus 5 has plates 4, 6, and 7 that are stacked and bonded to one another. Through-holes 6a and 6b are formed in the plate 6 immediately above the plate 4, and are overlapped with the electrodes 3, respectively. In the uppermost plate 7, a groove 7g that penetrates the plate 7 is formed. One end of the groove 7g is overlapped with the through-hole 6a of the plate 6 directly below, whereas the other end of the groove 7g is overlapped with the through-hole 6b.

Thus, the experimental apparatus 5 is provided with a micro flow channel having the through-holes 6a and 6b and the groove 7g. Both ends of the micro flow channel are closed with the two electrodes 3. Liquid can be stored in the micro flow channel, and liquid can be introduced through the groove 7g. The width of the groove 7g was 1 mm, whereas the diameters of the through-holes 6a and 6b were 2 mm.

PBS (phosphate buffered saline) was supplied to the micro flow channel from the groove 7g. The PBS used was PBS (-) without calcium or magnesium.

Figure 4:
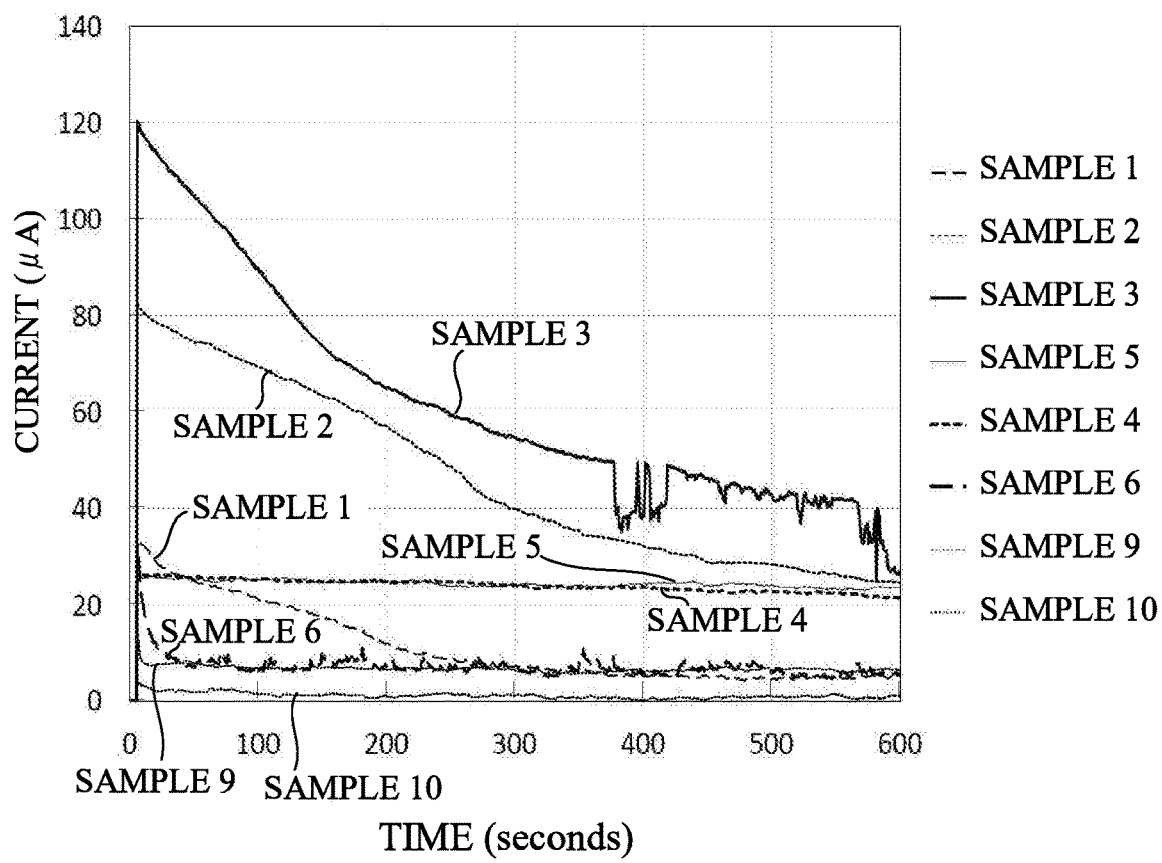
FIG. 4 is a graph showing the test results of the conductivities of the samples.

A battery 8 (DC power supply) was connected to the electrodes 3 on the surface of the plate 4 via lead wires, and a voltage of 0.3V was applied so that a DC current flowed through the electrodes 3. Variation of the electric current value was measured by an ammeter 9 for 600 seconds (10 minutes) immediately after the beginning of electric current supply (voltage application). FIG. 4 shows the measurement results.

As is clear from FIG. 4, in Samples 2 and 3, a very large current flowed immediately after the beginning of voltage application, but the current value decreased with time.

In Sample 1, the current value gradually decreased immediately after the beginning of voltage application. The reason for large decrease in the current value in samples 1-3 is presumed to be due to the low ion content. The reason why the current value was unstable in Sample 3 is presumed to be that contact of silver chloride particles with PBS was unstable because the surfaces of silver chloride particles were coated with hydrophobic fumed silica.

Sample 4 contained hydrophilic fumed silica as similar to Sample 2 and more silver chloride, and the sodium chloride concentration in the solution used in the salt water treatment was increased. In Sample 4, the current value was stabilized for over 600 seconds after the beginning of voltage application. It is presumed that this is because the silicone rubber contained in the silver-silver chloride electrodes contain a large amount of chloride ions and sodium ions derived from sodium chloride, so that the conductivity is improved and the higher conductivity can be stably maintained by the ions.

Sample 5 used the same materials as Sample 2, and was subjected to the salt water treatment in the same solution as Sample 4. In sample 5, the current value was also stabilized for 600 seconds after the beginning of voltage application. As is clear from comparison of Samples 4 and 5, even though the silver chloride content was different, the current value was stable for a long time if the sodium chloride concentration of the solution used in the salt water treatment was higher.

Sample 6 used the same materials as Sample 4, but used hydrophobic fumed silica instead of hydrophilic fumed silica and was subjected to the salt water treatment. In Sample 6, the current value decreased most quickly among Samples 1 to 6 having the silver-silver chloride electrodes 3 and the current value was unstable.

In Samples 9 and 10 having the silver electrodes 3 manufactured for comparison, the current values were lower than those of Samples 2 to 5 having the silver-silver chloride electrodes 3. However, the current value of Sample 10 that was subjected to the salt water treatment in a solution having a higher sodium chloride concentration was lower than that of Sample 9.

In Samples 1 and 6, the current decreased more than Sample 9 having silver electrodes 3 at 300 seconds (5 minutes) after the beginning of voltage application. In other words, it is understood that among the samples having the silver-silver chloride electrodes 3, Samples 2 to 5 had good performance. In microfluidic devices, it is required that electrodes have high conductivity from the viewpoint of shortening the measurement time. Even Samples 2 and 3 having a large decrease in current can also be used utilizing the high conductivity, as long as the measurement is for a short time. Therefore, Samples 2 to 5 containing fumed silica and subjected to the salt water treatment in a sodium chloride aqueous solution are preferred.

In addition, from the viewpoint of stability of the current value, it is understood that Samples 2, 4 and 5 containing hydrophilic fumed silica are preferable, and Sample 4 and Sample 5 subjected to the salt water treatment in a higher concentration sodium chloride aqueous solution had good performance. However, Sample 2 containing hydrophobic fumed silica is also preferable because of the high conductivity, as long as the measurement is for a short time.

OTHER MODIFICATIONS

Although the present invention has been described above, the foregoing description is not intended to limit the present invention. Various modifications including omission, addition, and substitution of structural elements may be made within the scope of the present invention.

REFERENCE SYMBOLS

1: Substrate
2: Paste
3: Silver-Silver Chloride Electrode
4: Plate
5: Experimental Apparatus
6: Plate
7: Plate
6a, 6b: Through-hole
7g: Groove

The invention claimed is:

1. A production method for producing a silver-silver chloride electrode, comprising:
    mixing silver powder, silver chloride powder, a dispersant, and fumed silica powder with a liquid silicone rubber binder to produce a paste;
    coating the paste on a substrate made of silicone rubber;
    curing the paste on the substrate to form an electrode containing silver and silver chloride; and
    immersing the electrode in a sodium chloride aqueous solution.

2. The production method according to claim 1, wherein producing the paste comprising mixing fumed silica powder and silver chloride powder, and mixing a mixture of fumed silica powder and silver chloride powder, silver powder and the dispersant into the binder.

3. The production method according to claim 1, wherein a concentration of sodium chloride in the sodium chloride aqueous solution is equal to or greater than 1%.

4. The production method according to claim 1, wherein a concentration of sodium chloride in the sodium chloride aqueous solution is equal to or greater than 1% and equal to or less than 10%.

5. The production method according to claim 1, wherein the fumed silica powder is hydrophilic.

6. The production method according to claim 2, wherein a concentration of sodium chloride in the sodium chloride aqueous solution is equal to or greater than 1%.

7. The production method according to claim 2, wherein a concentration of sodium chloride in the sodium chloride aqueous solution is equal to or greater than 1% and equal to or less than 10%.

8. The production method according to claim 2, wherein the fumed silica powder is hydrophilic.

* * * * *